US008427238B2

(12) United States Patent
Hull, Jr. et al.

(10) Patent No.: US 8,427,238 B2
(45) Date of Patent: Apr. 23, 2013

(54) PERFORMANCE OPTIMIZATION OF POWER AMPLIFIER

(75) Inventors: William P. Hull, Jr., Fairview, TX (US); James S. Wilson, Hurst, TX (US); Robert E. Leoni, Somerville, MA (US)

(73) Assignee: Raytheon Company, Waltham, MA (US)

( * ) Notice: Subject to any disclaimer, the term of this patent is extended or adjusted under 35 U.S.C. 154(b) by 11 days.

(21) Appl. No.: 13/155,321

(22) Filed: Jun. 7, 2011

(65) Prior Publication Data

US 2012/0313710 A1 Dec. 13, 2012

(51) Int. Cl.
*H03F 3/04* (2006.01)

(52) U.S. Cl.
USPC .......................................... 330/289; 330/298

(58) Field of Classification Search .................. 330/289, 330/207 P, 298, 279
See application file for complete search history.

(56) References Cited

U.S. PATENT DOCUMENTS

| 6,362,690 | B1 | 3/2002 | Tichauer | |
|---|---|---|---|---|
| 6,989,712 | B2* | 1/2006 | Liu et al. | 330/133 |
| 7,358,807 | B2* | 4/2008 | Scuderi et al. | 330/140 |
| 2002/0125945 | A1 | 9/2002 | Taylor | |
| 2005/0111574 | A1 | 5/2005 | Muller et al. | |
| 2005/0227646 | A1* | 10/2005 | Yamazaki et al. | 455/127.3 |
| 2006/0003711 | A1 | 1/2006 | Ouzillou et al. | |
| 2006/0197594 | A1* | 9/2006 | Scuderi et al. | 330/127 |
| 2011/0279192 | A1* | 11/2011 | Nash et al. | 333/105 |

FOREIGN PATENT DOCUMENTS

WO    WO 87/03378    6/1987

OTHER PUBLICATIONS

Yi Ren, et al., Distributed Temperature Sensor for Sensing of Multicore Systems, Laser Physics and Laser Technologies (RCSLPLT) and 2010 Academic Symposium on Optoelectronics Technology (ASOT, 2010 10th Russian-Chinese Symposium on, IEEE, Piscataway, NJ, Jul. 28, 2010 (pp. 356-359).
Extended European Search Report for European Application No. 12170722.8, in the name of Raytheon Company, Extended European Search Report dated Sep. 13, 2012 and mailed Sep. 20, 2012 (7 pgs.).

* cited by examiner

*Primary Examiner* — Henry Choe
(74) *Attorney, Agent, or Firm* — Christie, Parker & Hale, LLP

(57) ABSTRACT

Aspects of embodiments according to the present invention are directed toward a circuitry and a method to accurately measure the junction temperature of power amplifier and uses the measurement to enable optimization of performance in the presence of a mismatched load via control of the power amplifier such that corrective action to mitigate effects of the mismatched load can be performed.

23 Claims, 9 Drawing Sheets

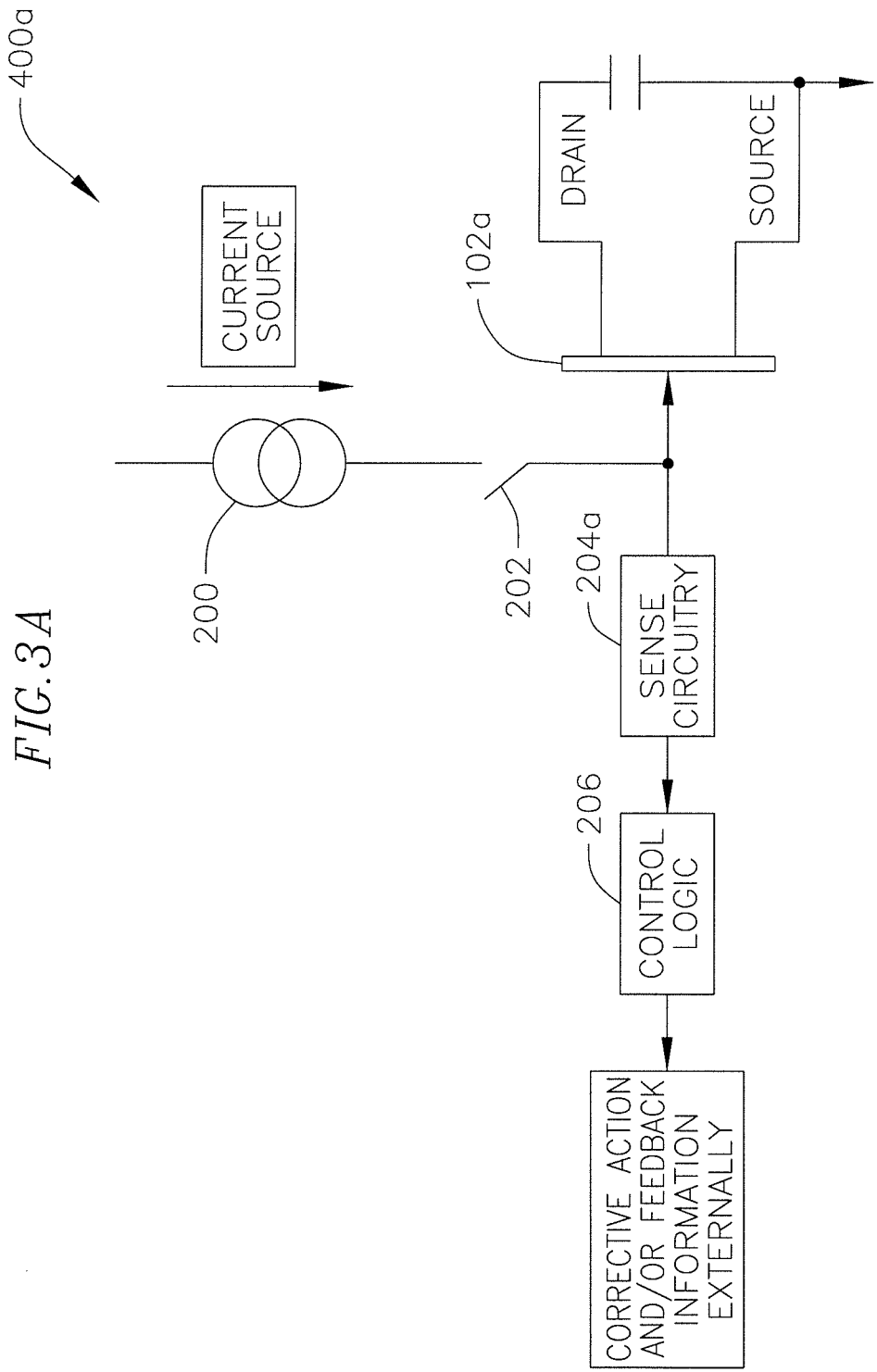

FIG. 7
Rf POWER OUT
AND
PAE CONTOURS
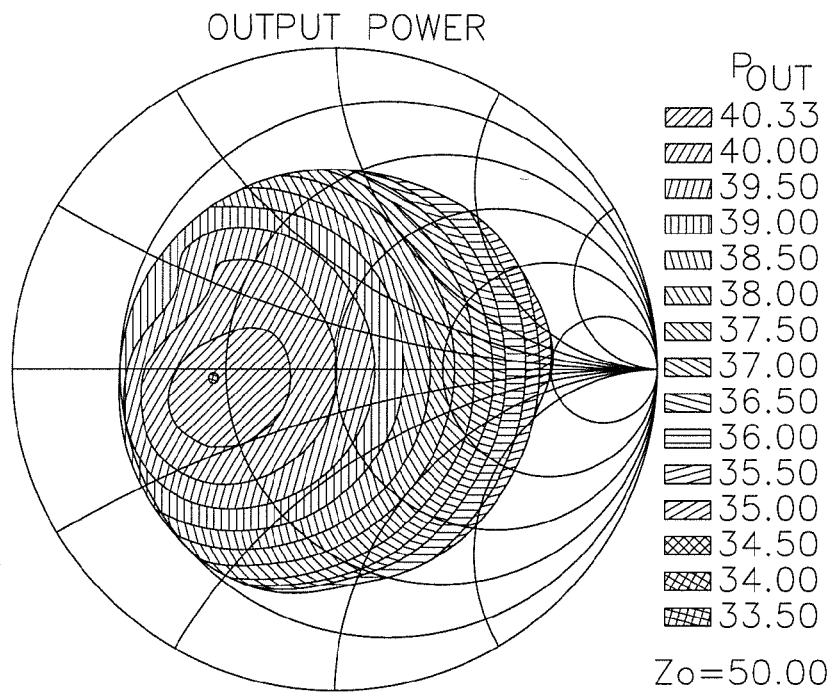
OUTPUT POWER
$P_{OUT}$
- 40.33
- 40.00
- 39.50
- 39.00
- 38.50
- 38.00
- 37.50
- 37.00
- 36.50
- 36.00
- 35.50
- 35.00
- 34.50
- 34.00
- 33.50
Zo=50.00
PAE ⟶ JUNCTION TEMPERATURE
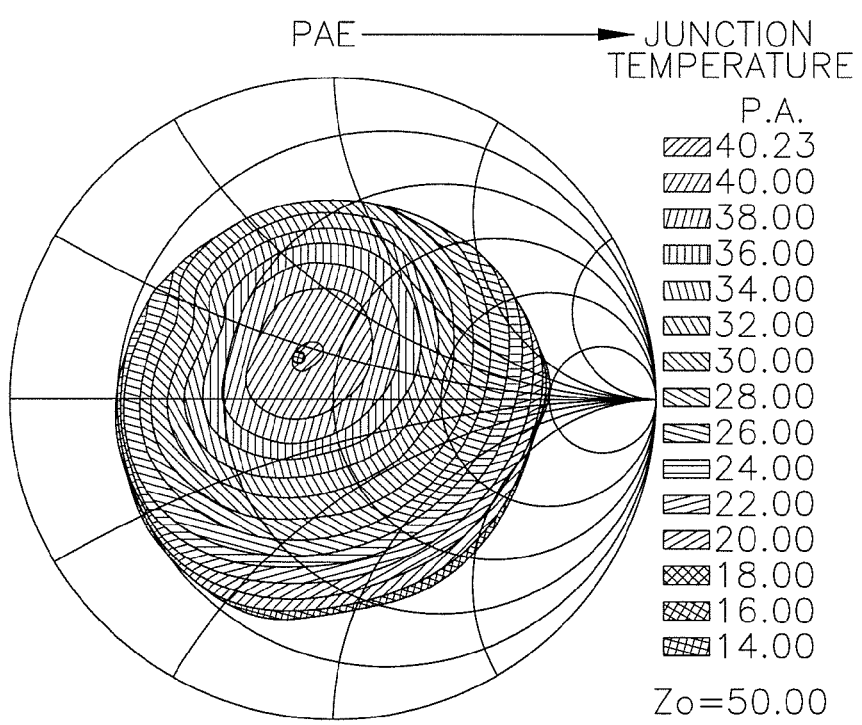
P.A.
- 40.23
- 40.00
- 38.00
- 36.00
- 34.00
- 32.00
- 30.00
- 28.00
- 26.00
- 24.00
- 22.00
- 20.00
- 18.00
- 16.00
- 14.00
Zo=50.00

PERFORMANCE OPTIMIZATION OF POWER AMPLIFIER

BACKGROUND

1. Field

Aspects of embodiments according to the present invention are directed toward the field of power amplifiers, and in particular, performance optimization of power amplifiers in RF systems.

2. Description of Related Art

In an RF system, e.g., a radar system, wireless communication system, etc., power amplifiers are designed to efficiently convert DC power to RF power. To achieve this goal effectively, the constituent transistors are presented with favorable impedances that optimally perform this energy conversion. In addition, the network that presents this favorable impedance also provides an efficient (low loss) power transformation to the follow on circuitry. It is desirable to maintain this low loss transformation, however this results in the performance of the power amplifier being highly sensitive to the load (e.g., impedance) presented by the follow on circuitry. A mismatch between the power amplifier and the load presented to it may in turn enhance or deteriorate DC-to-RF power conversion. Poor power conversion at the output stage results in power dissipated within the transistor of the output stage and correspondingly an increase in the device's temperature (e.g., junction temperature for a bipolar transistor or a field effect transistor) and a corresponding reduction in long-term reliability. Therefore, an optimized balance between RF power generation and long term reliability is desired.

In the related art, a circulator/isolator is typically utilized to protect the power amplifier from mismatch conditions. The circulator/isolator is used to control the impedance seen by the output stage of the power amplifier. However, the bandwidth of the circulator/isolator may limit utilization of the available area for the aperture. For example, in an active electronically scanned antenna (AESA), the circulator/isolator provides the duplexing function between transmit and receive, as well as to isolate the power amplifier from the active impedance of the AESA. While the circulator/isolator can mitigate the mismatch problem between the power amplifier and the load, as the operational bandwidth increases and/or the low end frequency gets lower, the size and weight of the circulator/isolator becomes a limiter in terms of how many active elements can be provided given space constraints. Some AESA designs partition the active area into a transmit and a receive aperture because the bandwidth exceeds that possible with typical circulator/isolator technology. However, such an approach reduces the available area for use for both the transmit and receive functions and does not alter the large impedance variation presented to the power amplifier as the beam is steered.

SUMMARY

The accompanying drawings, together with the specification, illustrate exemplary embodiments of the present invention, and, together with the description, serve to explain the principles of the present invention.

Exemplary embodiments of the present invention relate to a mechanism to accurately measure the temperature of a power amplifier such that corrective action can be taken to optimize the two opposing requirements of the power amplifier, namely, RF power generation and long term reliability.

According to an embodiment of the present invention, a circuit includes an amplifier circuit for driving an RF load, a sensor for sensing a temperature condition of the amplifier circuit, and a controller for initiating corrective action and/or feedback of the temperature condition to an external controller in accordance with a load condition of the RF load.

In an embodiment, the load condition may include an impedance mismatch condition.

In an embodiment, the amplifier circuit may be configured to drive the RF load with or without a circulator or an isolator coupled between the amplifier circuit and the RF load.

In an embodiment, the sensor may be in thermal contact with the amplifier circuit such that the temperature sensed by the sensor correlates to that of at least one transistor of the amplifier circuit.

In an embodiment, the temperature sensed by the sensor may correlate to a junction temperature of the at least one transistor.

In an embodiment, the amplifier circuit may include a plurality of transistor cells, each of the at least one transistor being included in a corresponding one of the transistor cells, and the sensor may be included in a corresponding one of the transistor cells.

In an embodiment, the circuit may further include a sense circuitry for measuring a state of the sensor. The state may be a voltage or current output of the sensor.

In an embodiment, the sensor may include a diode coupled to the sense circuitry.

In an embodiment, the sensor may include a transistor coupled to the sense circuitry.

In an embodiment, the controller may be configured to adjust at least one operating condition of the amplifier circuit to compensate for a mismatch condition of the RF load.

In an embodiment, the at least one operating condition may include a bias condition of the amplifier circuit.

In an embodiment, the at least one operating condition may include a drain voltage of a transistor included in the amplifier circuit.

In an embodiment, the at least one operating condition may include a drive level provided to the amplifier.

In an embodiment, the controller may be configured to retune an output stage of the amplifier circuit.

According to another embodiment of the present invention, a method of operating an amplifier circuit includes operating the amplifier circuit to drive an RF load coupled to the amplifier circuit, sensing a temperature of the amplifier circuit, determining a mismatch condition between the RF load and the amplifier circuit in accordance with the temperature of the amplifier circuit, and compensating for the mismatch between the amplifier circuit and the RF load. This information is stored along with system parameters such as beam position for recall and application.

In an embodiment, the method may further include driving the RF load without a circulator or an isolator coupled between the amplifier circuit and the RF load.

In an embodiment, the compensating for the mismatch condition may include adjusting at least one operating condition of the amplifier circuit to compensate for the mismatch condition.

In an embodiment, the adjusting of the at least one operating condition may include adjusting a bias condition of the amplifier circuit.

In an embodiment, the adjusting of the at least one operating condition may include adjusting a drain voltage of a transistor included in the amplifier circuit.

In an embodiment, the adjusting of the at least one operating condition may include adjusting a drive level to the amplifier.

In an embodiment, the compensating for the mismatch condition may include retuning an output stage of the amplifier circuit in accordance with the temperature.

BRIEF DESCRIPTION OF THE DRAWINGS

FIG. 3A illustrates a conceptual block diagram in which a thermal sensor is implemented as a diode, according to an embodiment of the present invention.

FIGS. 7 and 8 are diagrams illustrating the concept of mismatch mitigation.

DETAILED DESCRIPTION

Figure 1:
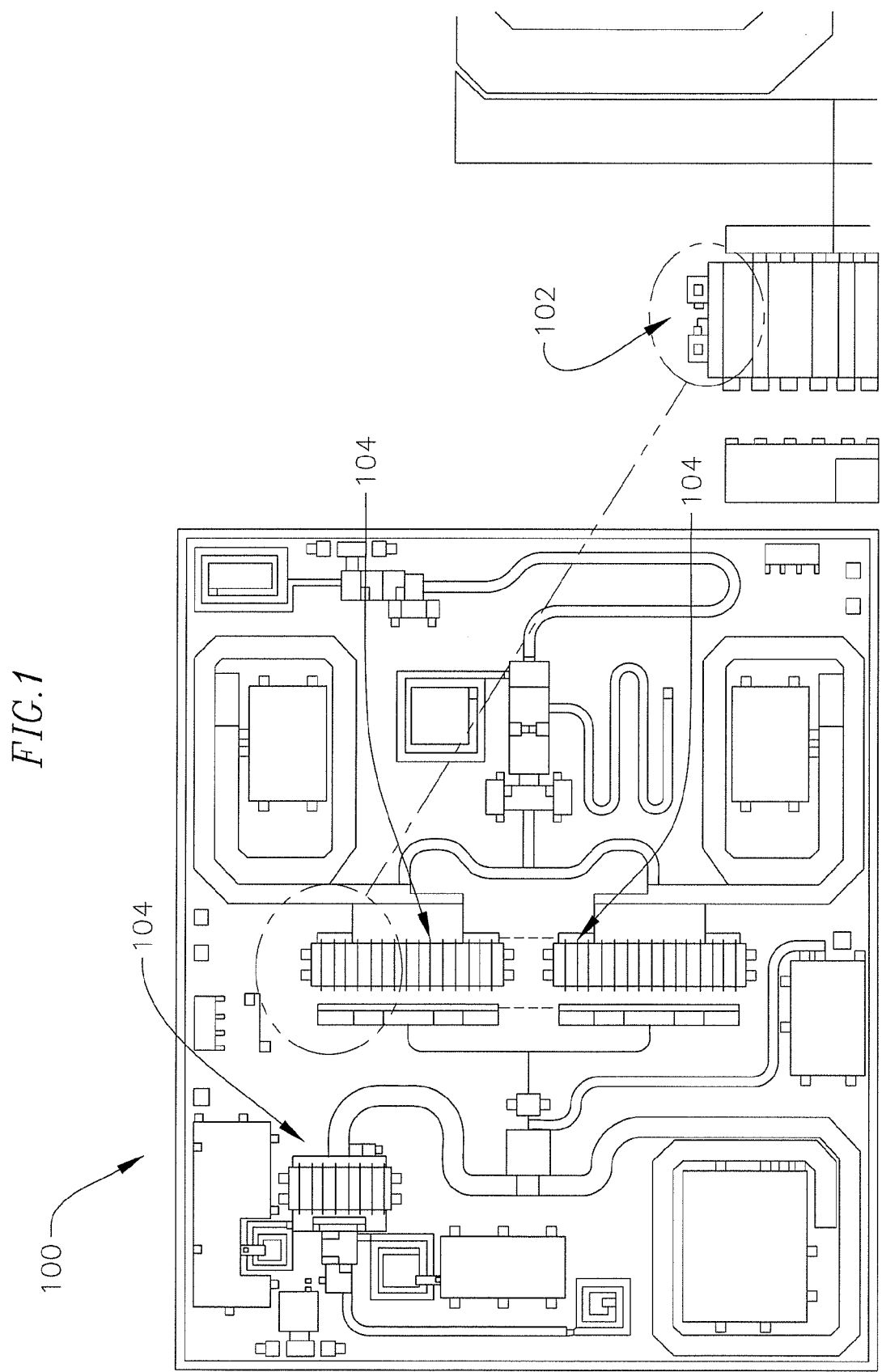
FIG. 1 is a circuit layout illustrating a representative placement of a thermal sensor in a power amplifier circuit layout.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when a circuit element is referred to as being "connected to" or "coupled to" another element, it can be directly connected to the element or be indirectly connected to the element with one or more intervening elements interposed therebetween. Hereinafter, like reference numerals refer to like elements.

Hereinafter, the embodiments of the present invention will be described in detail with reference to the accompanying drawings. To achieve an optimized balance between RF power generation and DC-to-RF power conversion, embodiments of the present invention disclose a mechanism to accurately measure the junction temperature of a transistor in a power amplifier to allow corrective action to be taken to optimize two opposing requirements (e.g., RF power generation and long term reliability). According to the embodiments of the present invention, an additional transistor cell is located to be in intimate thermal contact with the power amplifier in order to accurately measure the junction temperature of the transistor.

FIG. 1 is a drawing illustrating a representative placement of a thermal sensor 102 in a power amplifier layout 100. However, the present invention is not limited to the placement of the thermal sensor 102 shown in FIG. 1. The thermal sensor 102 may be positioned in other suitable locations.

In FIG. 1, the thermal sensor 102, which is in a transistor cell, is located in intimate thermal contact with the power amplifier FET 104. In some embodiments, the thermal sensor 102 is an additional transistor cell adjacent to a transistor of the power amplifier FET 104. The close proximity between the thermal sensor 102 and the power amplifier FET 104 provides a mechanism to accurately measure the junction temperature of the transistor in the power amplifier 104. With the junction temperature accurately measured, it is possible to assess potential reliability degradation of the transistor in the power amplifier 104 based on the junction temperature. For example, in an AESA application, this information enables control of the array to limit or reduce reliability degradation while allowing operation, albeit at reduced performance. Exemplary control operations that can be performed include controlling bias (e.g., reducing drain voltage) and retuning the output stage of the power amplifier. In case of potential abnormal failures, the bias of the power amplifier can be turned off so that the fault can be corrected or avoided without amplifier failures. In addition, the mechanism to determine the potential reliability degradation of the power amplifier enables high power transmit operation without circulator/isolator such that significant packaging density improvements can be achieved, as well as increasing bandwidth utilization of radiating elements.

According to embodiments of the present invention, the above described mechanism to accurately measure the junction temperature of the power amplifier facilitates accurate understanding of the relationship between MMIC life data to an actual measured junction temperature, rather than an absolute thermal model referenced to a baseplate temperature measurement. However, the embodiments still rely on a relative thermal model between the thermal sensor and RF cells of the power amplifier. When the temperature measured by the thermal sensor is above a predetermined threshold value, the drain voltage of the transistor may be reduced to minimize or reduce junction temperature, thereby enhancing reliability. Accordingly, the circulator/isolator may be eliminated from the system. Therefore, it affords more flexibility in efficient packaging of AESAs as well as using the radiating aperture over a wider bandwidth than would otherwise be permitted where circulator/isolators are employed. In addition, the embodiments provide a mechanism whereby mismatch can be minimized or reduced on an element by element basis. Some embodiments may include control mechanism to optimize performance, wherein tunable elements are provided in the design.

Figure 2:
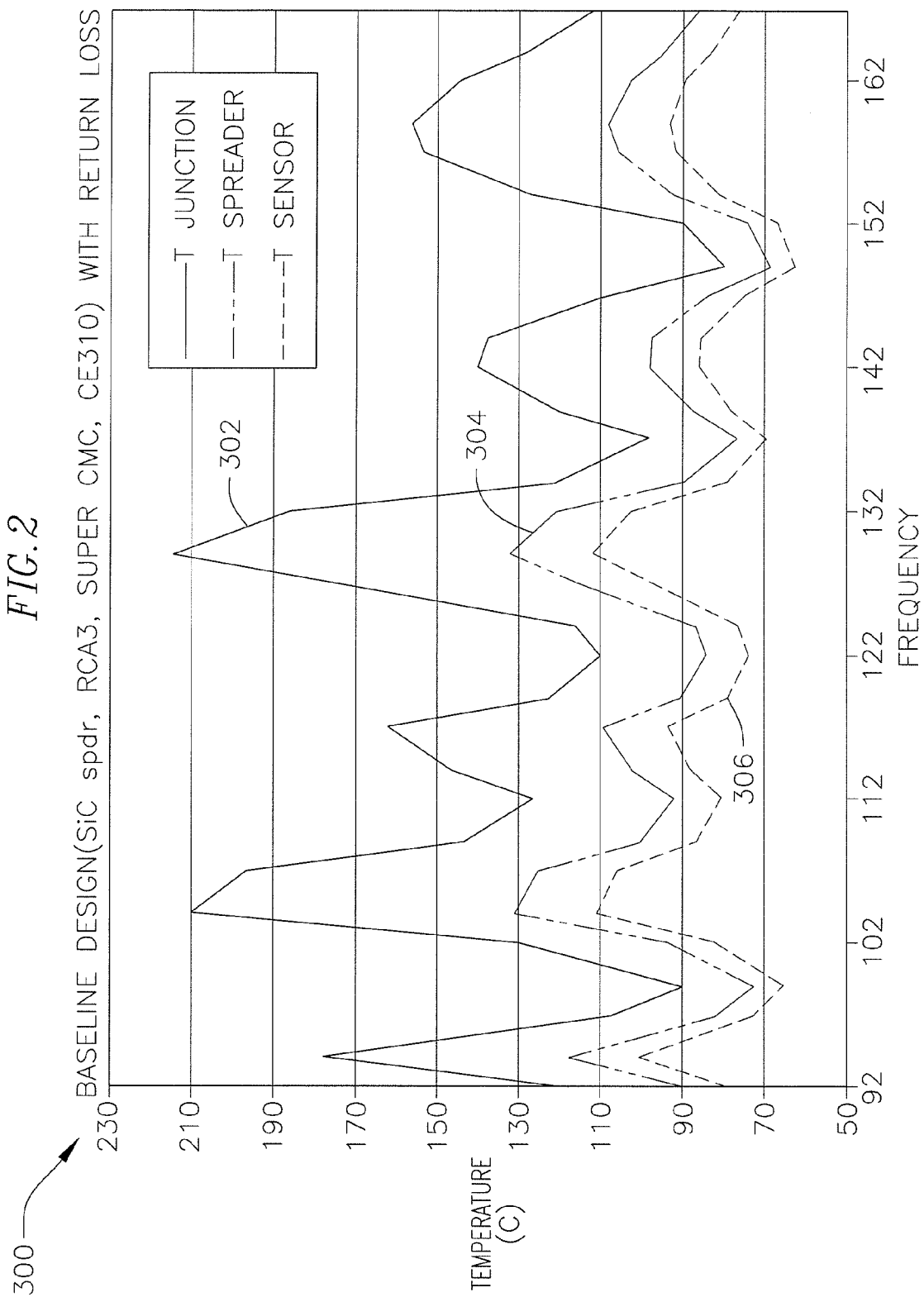
FIG. 2 is a graph illustrating the correlation between the temperature sensed by the thermal sensor of FIG. 1 and the junction temperature of a transistor in the power amplifier.

FIG. 2 is a graph 300 illustrating the correlation between the temperature sensed by the thermal sensor 102 and the junction temperature of a transistor in the power amplifier 104.

The graph 300 presents an analysis of the sensor temperature relative to the peak channel temperature of the power amplifier 104 under mismatched conditions. Due to the intimate thermal contact between the thermal sensor 102 and the transistor of the power amplifier 104, the temperature of the thermal sensor 102 is strongly correlated to that of the transistor (e.g., an RF transistor) of the power amplifier 104. As the current-voltage characteristics of a transistor are a function of temperature, the thermal sensor 102 can serve as an effective electrical probe of the RF transistor's condition and effectiveness in power conversion under different operating conditions. In FIG. 2, the curve 302 represents the junction (channel) temperature of the transistor in the power amplifier 104, the curve 304 represents the temperature of a thermal spreader, and the curve 306 represents the temperature of the thermal sensor 102. As shown in FIG. 2, the temperature of the thermal sensor 102 correlates to the temperature of the junction temperature of the transistor in the power amplifier 104 under different mismatched conditions.

FIG. 3A illustrates a conceptual block diagram 400a in which a thermal sensor 102a is implemented as a diode, according to an embodiment of the present invention.

In FIG. 3A, the thermal sensor 102a is a transistor configured in a diode configuration. The gate electrode of the transistor (thermal sensor 102a) is coupled to a current source 200 by a switch 202. The switch 202 may provide noise isolation when the temperature sensing function is performed. However, the switch 202 may be removed in other embodiments of the present invention. That is, the current source 200 may be connected to the gate electrode of the transistor 202 without the switch 202. A sense circuitry 204a is coupled to the gate electrode of the thermal sensor 102a, and a control logic 206 receives an output signal (e.g., a voltage signal or a current signal) from the sense circuitry 204a. By measuring the voltage at the gate of the thermal sensor 102a with the sense circuitry 204a, the control logic 206 can determine the temperature of the thermal sensor 102a based on its temperature-voltage characteristics. Because the temperature of the thermal sensor 102a strongly correlates to the channel temperature of the power amplifier 104 (shown in FIG. 1) due their intimate thermal contact, the control logic 206 can select the appropriate corrective action, if needed, to be performed on the power amplifier 104 based on the temperature of the thermal sensor 102a, which correlates to the junction temperature of the power amplifier 104. In some embodiments, the control logic 206 can provide feedback information based on the measured temperature to other external circuits (not shown) that can perform corrective actions, if needed, to the power amplifier 104.

Figure 3B:
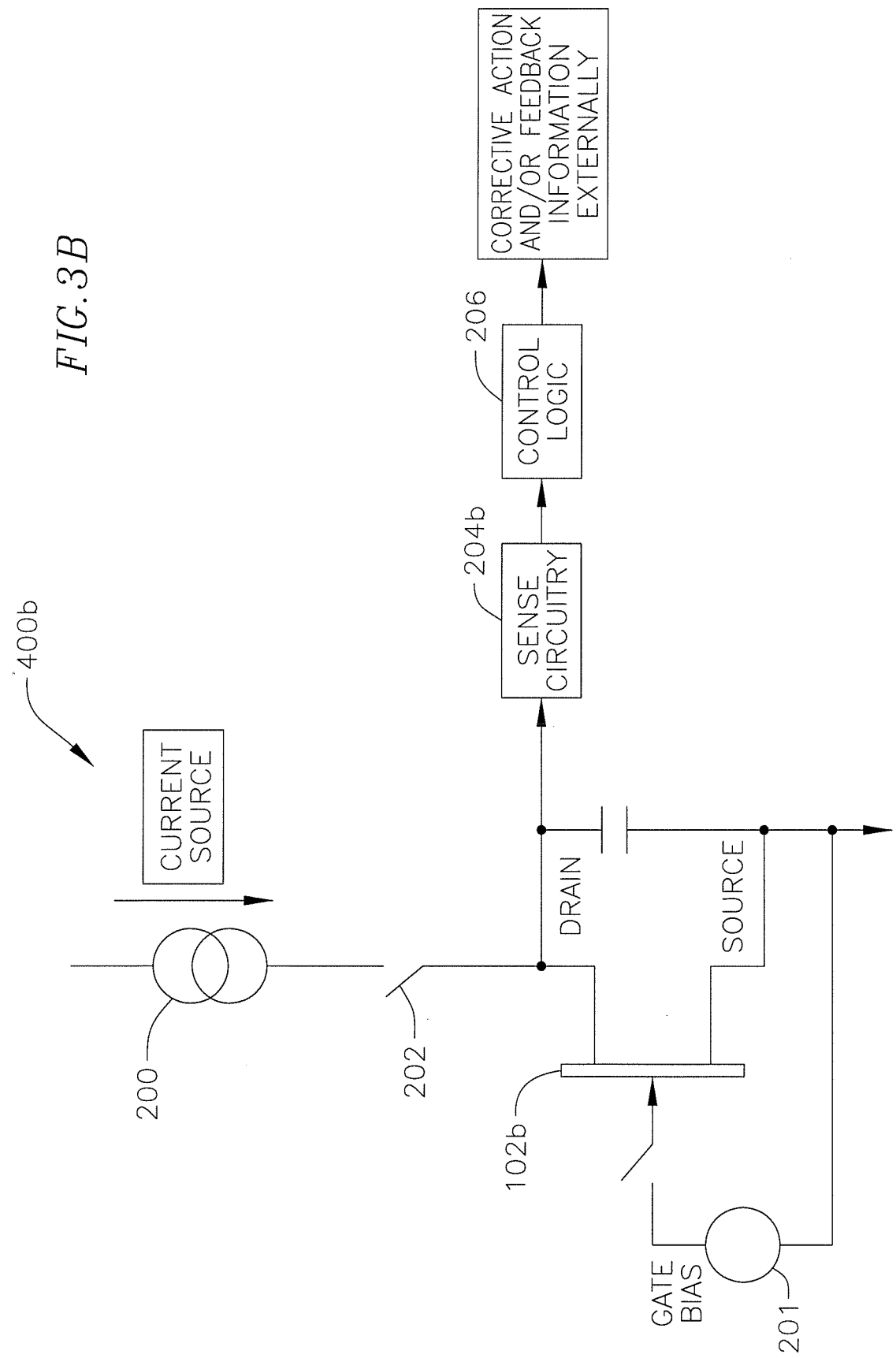
FIG. 3B illustrates a conceptual block diagram in which a thermal sensor is implemented as a transistor, according to an embodiment of the present invention.
Figure 4:
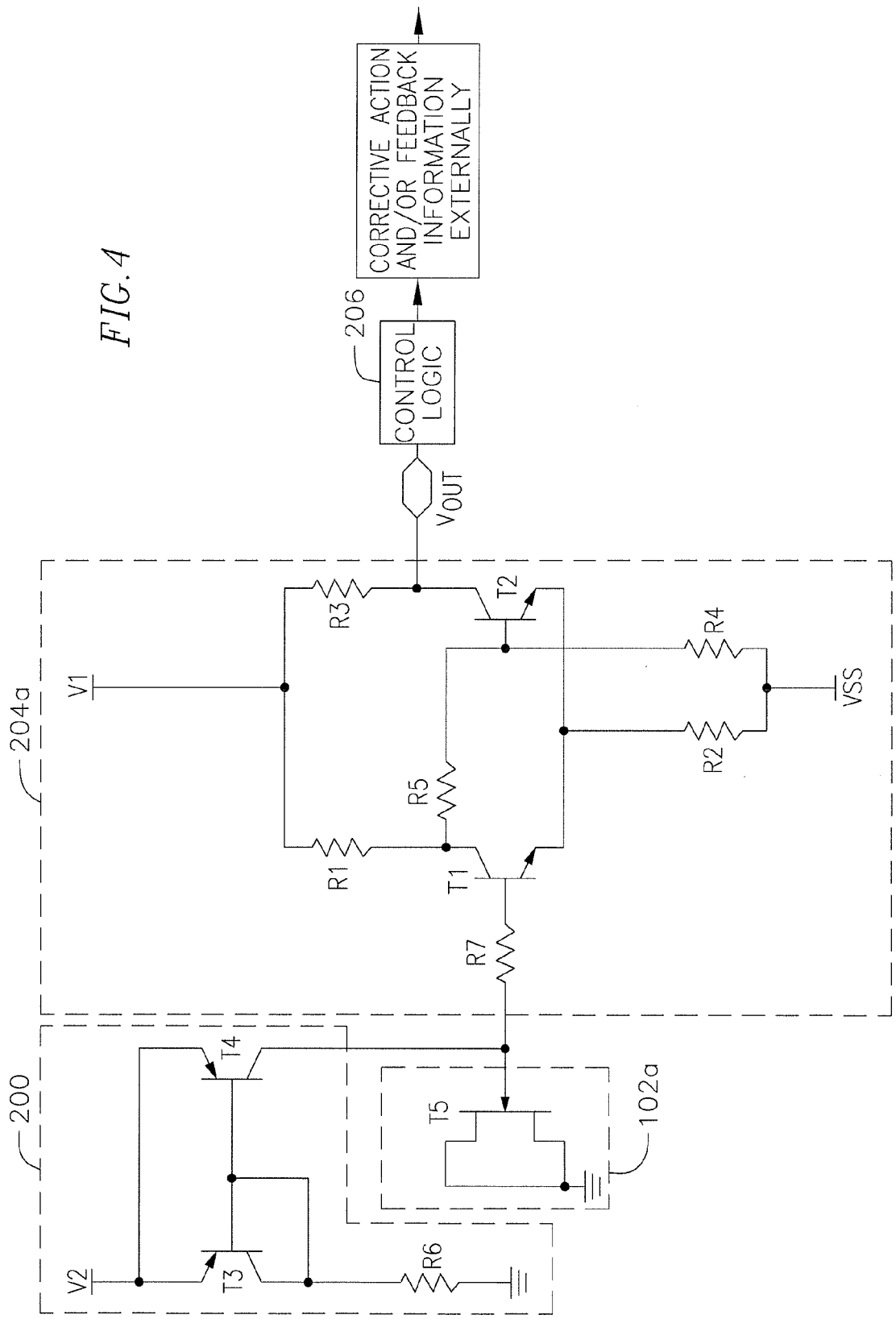
FIG. 4 is a circuit diagram illustrating a sense circuitry and a current source of FIG. 3A in more detail according to an embodiment of the present invention when the thermal sensor 202 is configured as a diode.

FIG. 4 is a circuit diagram illustrating the sense circuitry 204a and the current source of FIG. 3A in more detail according to an embodiment of the present invention when the thermal sensor 102a is configured as a diode.

In FIG. 4, the sense circuitry 204a includes a transistor T1 and a transistor T2. The first transistor T1 has a first electrode coupled to a voltage source V1 via a resistor R1, and a second electrode coupled to a voltage source VSS via a resistor R2. The transistor T2 has a first electrode coupled to the voltage source V1 via a resistor R3, and a second electrode coupled to the voltage source VSS via a resistor R4. The second electrode of the transistor T2 is also coupled to the control logic 206. The first electrode of the transistor T1 is coupled to a control electrode of the transistor T2 via a resistor R5. While the sense circuitry 204a in FIG. 4 is implemented with bipolar transistors, the present invention is not limited thereto. For example, the sense circuitry 204a may be implemented with MOS type transistors or other suitable transistors. In FIG. 4, the current source 200 includes a transistor T3 and a transistor T4. A first electrode of the transistor T3 is coupled to a voltage source V2, and a second electrode of the transistor T3 is coupled to a ground voltage source via a resistor R6. The voltage source VSS and the ground voltage source may be the same. The voltage sources V1 and V2 may have the same voltage. A control electrode of the transistor T3 is coupled to the second electrode thereof and a control electrode of the transistor T4. A first electrode of the transistor T4 is coupled to the voltage source V2, and a second electrode of the transistor T4 is coupled to a gate electrode of the transistor T5 constituting the thermal sensor 102a. The gate electrode of the transistor T5 is also coupled to a control electrode of the transistor T1 via a resistor R7.

FIG. 3B illustrates a conceptual circuit diagram 400b in which a thermal sensor 102b is implemented as a transistor.

In FIG. 3B, the thermal sensor 102b is a transistor having a gate electrode coupled to a gate bias voltage source 201 and a drain electrode coupled to a current source 200 by a switch 202. The switch 200 may provide noise isolation when the temperature sensing function is not performed. In some embodiments, the thermal sensor 102b may be connected to the current source 200 without the switch 202. A sense circuitry 204b is coupled to the drain electrode of the thermal sensor 102b, and the control logic 206 receives an output signal (e.g., a voltage signal or a current signal) from the sense circuitry 204b. By measuring the voltage at the drain electrode of the thermal sensor 102b with the sense circuitry 204b, the control logic 206 can determine the temperature of the thermal sensor 102b based on its temperature-voltage characteristics. Because the temperature of the thermal sensor 102b strongly correlates to the channel temperature of the power amplifier 104 (e.g., as shown in FIG. 1) due their intimate thermal contact, the control logic 206 can select the appropriate corrective action, if needed, to be performed on the power amplifier 104 based on the temperature of the thermal sensor 102b, which correlates to the junction temperature of the power amplifier 104. In some embodiments, the control logic 206 can provide feedback information based on the measured temperature to other external circuits (not shown) that can perform corrective actions, if needed, to the power amplifier 104.

Figure 5:
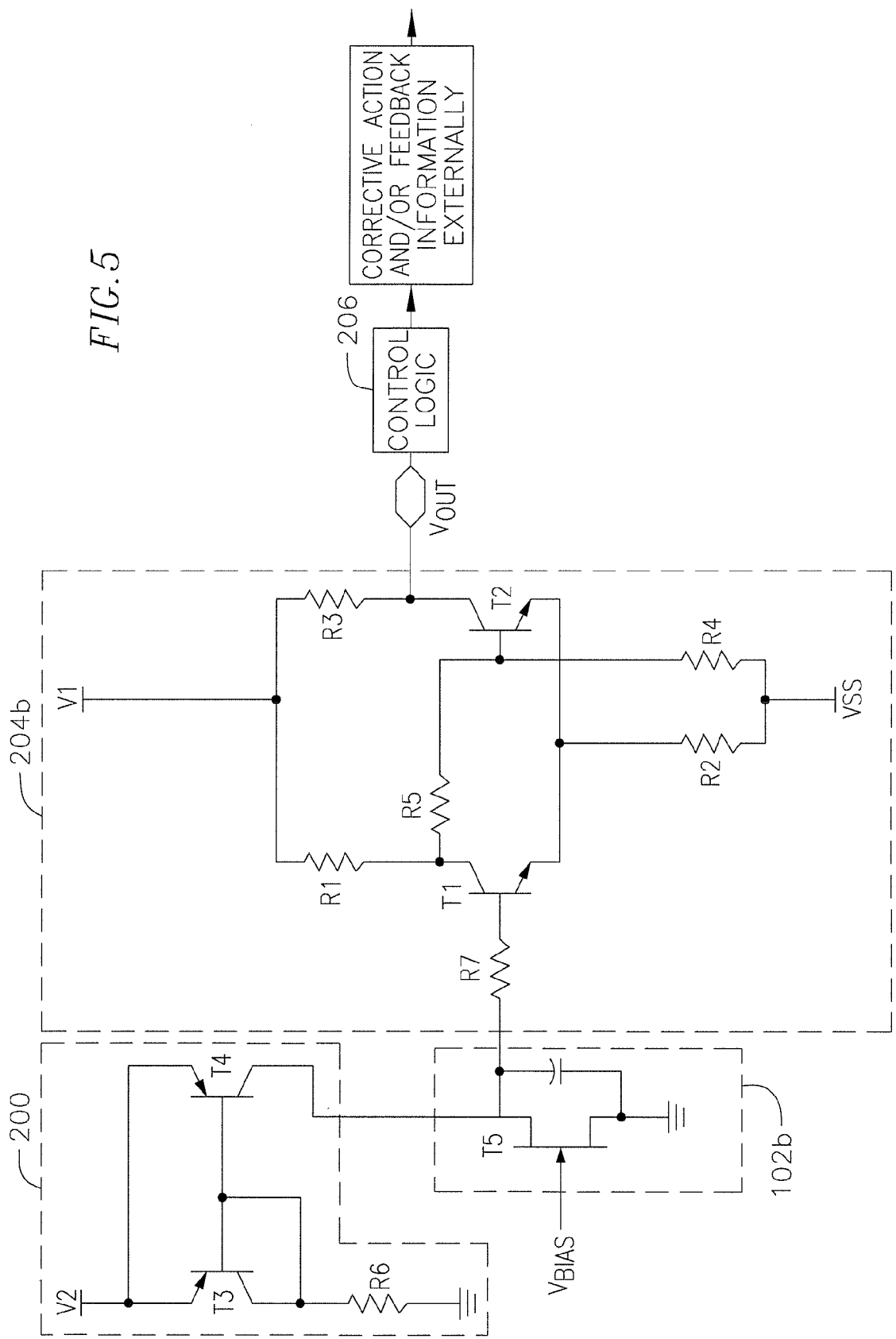
FIG. 5 is a circuit diagram of a sense circuitry according to an embodiment of the present invention when the thermal sensor is configured as a transistor.

FIG. 5 is a circuit diagram of the sense circuitry 204b in more detail according to an embodiment of the present invention when the thermal sensor is configured as a transistor.

In FIG. 5, the circuitries of the sense circuitry 204b and the current source 200 in FIG. 5 are substantially the same as those of the sense circuitry 204a and the current source 200 in FIG. 4. Therefore, redundant description thereof will not be repeated. In FIG. 5, the thermal sensor 102b is configured as a transistor T5 that has a first electrode coupled to the current source 200 and the sense circuitry 204b, and a second electrode coupled to the ground voltage source. A capacitor C is coupled between the first electrode and the second electrode of the transistor T5. The gate electrode of the transistor T5 is applied with a suitable bias voltage.

Figure 6:
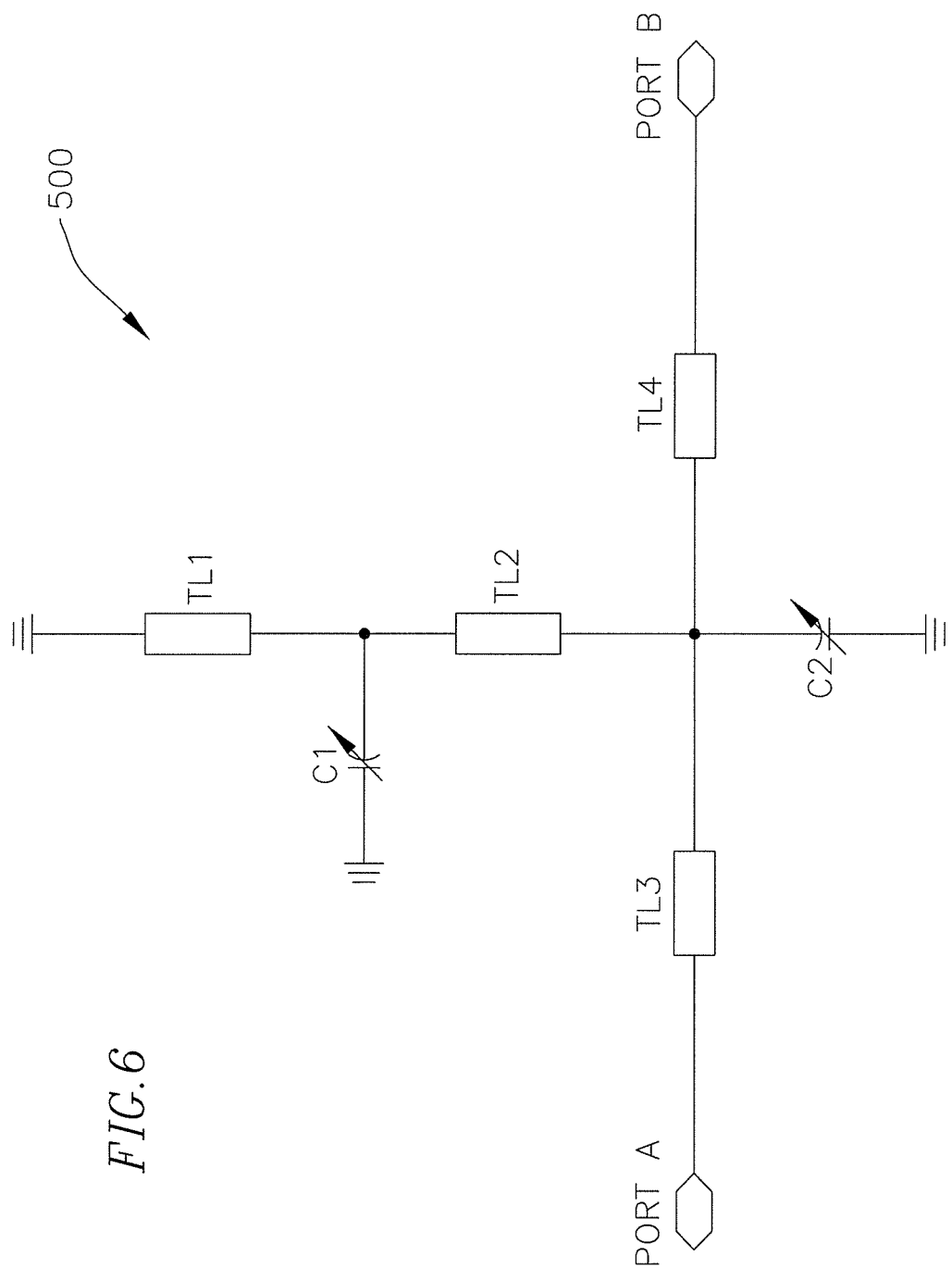
FIG. 6 is a circuit diagram of an exemplary tuning circuit in which circuit elements are tunable to compensate for a mismatch condition between the power amplifier and a load.

FIG. 6 is a circuit diagram of an exemplary tunable circuit 500 in which circuit elements are tunable to compensate for a mismatch condition between the power amplifier and a load. This circuit 500 is a simple reactive tuning network that can be used to improve the impedance presented to the power amplifier (coupled to port A) when the follow on circuitry (coupled to part B) results in a non-ideal impedance. The simple network makes use of variable capacitances C1 and C2 to realize the reconfigurable network.

Figure 8:
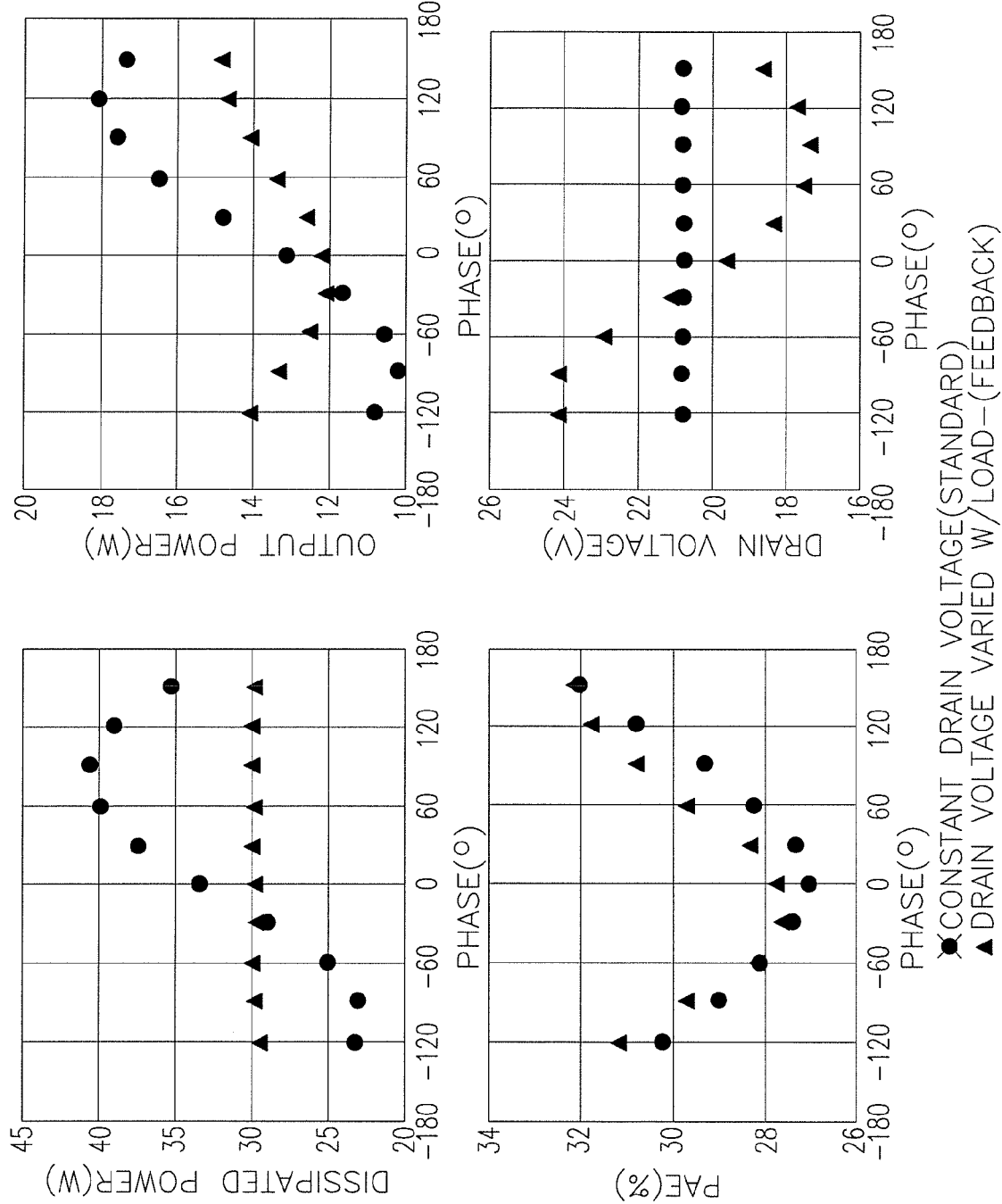

FIGS. 7 and 8 are diagrams for illustrating the concept of mismatch mitigation.

FIG. 7 shows contours of RF power out and power added efficiency (PAE) for an exemplary power amplifier as a function of load presented to the power amplifier. As PAE decreases, the power amplifier junction temperature will increase which in turn will be sensed by the thermal sensor. FIG. 8 illustrates the use of the temperature sensor in a situation wherein the load magnitude is constant but the load phase varies. This description is to be regarded as illustrative in nature and not restrictive because the concept is applicable for varying load magnitude and/or phase. The data points shown as circles represent data points obtained without the use of the information provided by the thermal sensor. The data points shown as triangles represent data points obtained by using the feedback from the thermal sensor to adjust the drain voltage.

According to the exemplary embodiments of the present invention, the temperature of the thermal sensor 102 can be used as a basis for adjusting the voltage (e.g., bias voltage) supplied to the power amplifier 104, thus adjusting the power dissipation and thereby optimizing channel temperature and power generation. In some applications, such as active electronically scanned antennas (AESAs), this temperature may be sensed and recorded as a function of frequency and scan angle during calibration. The suitable voltages to control channel temperature can then be stored in a calibration file. During field operation, a periodic built-in test sequence can be implemented to support prognostication of performance and reliability over the life of the power amplifier and/or AESA. In some cases, only the amplifiers at the edges of the AESA may be adversely affected at a particular frequency or scan angle. In this case, the corrective action may be to turn those few amplifiers off and leave the voltage on for the majority of the amplifiers in the AESA.

In the related art, an isolator or circulator may be utilized after the power amplifier in RF systems as a way to control the impedance seen by the power amplifier. In a comparative example, in an AESA, the circulator provides the duplexing function between transmit and receive as well as to isolate the power amplifier from the active impedance of the AESA. Utilization of the circulator or isolator is usually the typical solution used in the related art. As the operational bandwidth increases and/or the low end frequency gets lower, the size and weight of the circulator/isolator becomes a limiter in terms of how many active elements can be provided given space constraints. If the bandwidth ratio is too large, the current state of the art circulator/isolator would not support the requirement, e.g., frequency ratios ($f_{high}/f_{low}$) in excess of 4:1. However, according to embodiments of the present invention, the power amplifier is coupled to the radiating elements without a circulator/isolator while providing a mechanism to optimize power transfer and avoid degradation of the power amplifier. In some embodiments, the duplexer function can be implemented with a solid state switch. Since there is no isolation when a switch is utilized, the embodiments of the present invention described herein can be utilized to apply the appropriate corrective action to prevent or reduce reliability degradation to the power amplifier.

Further, because the embodiments of the present invention provide insight as to the mismatch between the power amplifier and the external load, they can provide data whereby the mismatch may be minimized or reduced on an element by element basis. This improvement may be a fixed implementation in the circuit design. For the case of designs incorporating tunable elements, the embodiments of the present invention may provide the mechanism to optimize the selection of the tuning elements. This information is stored along with system parameters such as beam position for recall and application.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A circuit comprising:
    an amplifier circuit for driving an RF load;
    a sensor for sensing a temperature condition of the amplifier circuit; and
    a controller for initiating corrective action and/or feedback of the temperature condition to an external controller in accordance with a load condition of the RF load,
    wherein the sensor is in thermal contact with the amplifier circuit such that the temperature sensed by the sensor correlates to that of at least one transistor of the amplifier circuit, and
    wherein the amplifier circuit comprises a plurality of transistor cells, each of the at least one transistor being included in a corresponding one of the transistor cells, and the sensor is included in a corresponding one of the transistor cells.

2. The circuit of claim 1, wherein the load condition comprises an impedance mismatch condition.

3. The circuit of claim 1, wherein the amplifier circuit is configured to drive the RF load without a circulator or an isolator coupled between the amplifier circuit and the RF load.

4. The circuit of claim 1, wherein the temperature sensed by the sensor correlates to a junction temperature of the at least one transistor.

5. The circuit of claim 1, further comprising a sense circuitry for measuring a state of the sensor.

6. The circuit of claim 5, wherein the sensor comprises a diode coupled to the sense circuitry.

7. The circuit of claim 5, wherein the sensor comprises a transistor coupled to the sense circuitry.

8. The circuit of claim 1, wherein the controller is configured to adjust at least one operating condition of the amplifier circuit to compensate for a mismatch condition of the RF load.

9. The circuit of claim 8, wherein the at least one operating condition comprises a bias condition of the amplifier circuit.

10. The circuit of claim 9, wherein the at least one operating condition comprises a drain voltage of a transistor included in the amplifier circuit.

11. The circuit of claim 8, wherein the at least one operating condition comprises a drive level to the amplifier circuit.

12. The circuit of claim 1, wherein the controller is configured to retune an output stage of the amplifier circuit.

13. A method of operating an amplifier circuit, the method comprising:
    operating the amplifier circuit to drive an RF load coupled to the amplifier circuit;
    sensing a temperature of the amplifier circuit using a sensor, wherein the sensor is in thermal contact with the amplifier circuit such that the temperature sensed by the sensor correlates to that of at least one transistor of the amplifier circuit, and wherein the amplifier circuit comprises a plurality of transistor cells, each of the at least one transistor being included in a corresponding one of the transistor cells, and the sensor is included in a corresponding one of the transistor cells;
    determining a mismatch condition between the RF load and the amplifier circuit in accordance with the temperature of the amplifier circuit; and
    compensating for the mismatch condition between the amplifier circuit and the RF load.

14. The method of claim 13, wherein the mismatch condition comprises an impedance mismatch condition.

15. The method of claim 13, further comprising driving the RF load without a circulator or an isolator coupled between the amplifier circuit and the RF load.

16. The method of claim 13, wherein the sensed temperature correlates to that of at least one transistor of the amplifier circuit.

17. The method of claim 16, wherein the sensed temperature correlates to a junction temperature of the at least one transistor.

18. The method of claim 13, wherein compensating for the mismatch condition comprises adjusting at least one operating condition of the amplifier circuit.

19. The method of claim 18, wherein the adjusting of the at least one operating condition comprises adjusting a bias condition of the amplifier circuit.

20. The method of claim 18, wherein the adjusting of the at least one operating condition comprises adjusting a drive level to the amplifier circuit.

21. The method of claim 18, wherein the adjusting of the at least one operating condition comprises adjusting a drain voltage of a transistor included in the amplifier circuit.

22. The method of claim 13, wherein compensating for the mismatch condition comprises retuning an output stage of the amplifier circuit in accordance with the temperature.

23. The method of claim 13, further comprising performing prognostication of performance and reliability over the life of the amplifier circuit and/or an active electronically scanned antenna including the amplifier circuit.

\* \* \* \* \*